(12) United States Patent
Konishi

(10) Patent No.: US 6,168,977 B1
(45) Date of Patent: Jan. 2, 2001

(54) METHOD OF MANUFACTURING A SEMICONDUCTOR DEVICE HAVING CONDUCTIVE PATTERNS

(75) Inventor: Mamoru Konishi, Miyagi (JP)

(73) Assignee: Oki Electric Industry Co., Ltd., Tokyo (JP)

(*) Notice: Under 35 U.S.C. 154(b), the term of this patent shall be extended for 0 days.

(21) Appl. No.: 09/135,553

(22) Filed: Aug. 18, 1998

(30) Foreign Application Priority Data

Aug. 26, 1997 (JP) .................................................... 9-229177

(51) Int. Cl.[7] .................................................... H01L 21/82
(52) U.S. Cl. ............................ 438/132; 438/705; 438/601
(58) Field of Search .................................. 438/132, 600, 438/601, 308, 131, 705; 257/528

(56) References Cited

U.S. PATENT DOCUMENTS

| | | | | |
|---|---|---|---|---|
| 5,235,205 | * | 8/1993 | Lippitt, III | 257/528 |
| 5,965,927 | * | 10/1999 | Lee et al. | 257/529 |
| 6,011,286 | * | 1/2000 | Wu | 257/309 |

* cited by examiner

Primary Examiner—Amir Zarabian
Assistant Examiner—Bradley K Smith
(74) Attorney, Agent, or Firm—Jones Volentine, L.L.C.

(57) ABSTRACT

A method of manufacturing a semiconductor device having a fuse conductive pattern is disclosed. The method includes forming a fuse conductive pattern on a silicon substrate and forming a first insulation layer on the fuse conductive pattern and the silicon substrate. The first insulation layer has a first etching speed. The method further includes forming a stopper pattern on a first region of the first insulation layer to cover the fuse conductive pattern and forming a second insulating layer on the stopper pattern and the first insulation layer. The stopper pattern has a second etching speed and the second insulation layer has a third etching speed. A second region of the second insulating layer is etched to form an opening. The second region is within the first region. An etching condition is set such that the first etching speed is higher than the second etching speed so that the stopper pattern is exposed at a bottom of the opening. The exposed stopper pattern is etched with an etching condition that the second etching speed is faster than the third etching speed so that the exposed stopper pattern is removed and the first insulation layer remains on the fuse conductive pattern.

20 Claims, 4 Drawing Sheets

METHOD OF MANUFACTURING A SEMICONDUCTOR DEVICE HAVING CONDUCTIVE PATTERNS

BACKGROUND OF THE INVENTION

1. Field of the Invention

The present invention relates to a method-of manufacturing a semiconductor device having fuse conductive patterns for repairing electrical deficiencies of the semiconductor device. The present invention also relates to a method of inspecting whether or not a fuse part of the semiconductor device is normally formed in its structure.

2. Description of the Related Art

An electrical deficiency of a semiconductor device (LSI) is difficult to find in the course of production process. It is usually discovered in an electrical test performed after the production process, that is, the manufacturing process of the semiconductor device is complete. Some semiconductor device has fuse conductive patterns to repair the electrical deficiencies after the electrical test. The electrical deficiencies discovered in the test can be repaired by cutting the fuse conductive patterns with laser beam (referred to as "fuse blow" hereinafter).

A fuse part includes a fuse conductive patterns, a fuse cover layer formed on the conductive patterns and a fuse opening formed on the fuse cover layer. The fuse opening is formed to etch an interlayer insulation layer on the fuse cover layer. At fuse part of good quality, where fuse structure is normal, the fuse blow can be normally performed and the fuse conductive pattern is cut off. The fuse blow is one of the important factors for achieving good production quantity or production yield of the LSI having the fuse conductive pattern. Following conditions must be satisfied in order for the correct fuse blow.

(1) A fuse conductive pattern should be completely covered by the fuse cover layer. If the fuse conductive pattern is exposed during production process or is left being exposed to the air, a resistance value of the fuse conductive pattern is changed. If the resistance value is changed, the LSI may get unstable in its circuits operation, because a fuse conductive pattern with no fuse blow performed may operate in a similar way as a fuse conductive pattern with the fuse blow performed.

(2) A thickness of the fuse cover layer should be thin enough everywhere in a wafer so that the fuse conductive pattern can be cut by laser beam during the fuse blow.

(3) Where the interlayer insulation layer formed on the fuse cover layer includes an insulation layer having a water absorption property, such layer should be completely removed inside the fuse opening hole. If the insulation layer is exposed on the bottom of the fuse opening hole, the LSI conductive pattern may get corrosion.

For the purpose of etching the interlayer insulation layer formed on the fuse cover layer, an etching condition should be set that a selective ratio of an etching speed of the fuse cover layer to an etching speed of the interlayer insulation layer should be lower than 1. However, since the fuse cover layer is made of insulation material, the selective ratio of the fuse cover layer to the interlayer insulation layer may be 1 or more (which means etching speed of the fuse cover layer is faster than that of the interlayer insulation layer). Also, according to the prior art, the interlayer insulation layer is difficult to be formed as having a uniform layer thickness everywhere in a wafer. Accordingly, the fuse cover layer is overly etched at an area of a wafer, where the interlayer insulation layer is too thin, and the interlayer insulation layer is left without being etched out at an area of a wafer, where the interlayer insulation layer is too thick. Thus as the fuse cover layer on the fuse circuits can not be left, having a uniform thickness everywhere in a wafer so as not to meet the conditions described in the above (1) and (2). Where the conditions (1) and (2) are not satisfied, the fuse blow cannot be performed correctly and the LSI has a malfunction. Also the condition described in the above (3) can sometimes not be complied with due to the remainder of the interlayer insulation layer.

In addition, there is no suitable method of inspecting a thickness of the remainder of the fuse cover layer formed within the fuse opening hole except for a breakdown inspection. That is, a thickness of the remainder of fuse cover layer inside the fuse opening area can not be directly measured. Accordingly, a dummy fuse cover layer is formed in a monitor area and it is etched together with the fuse cover layer inside the fuse opening hole. Then, a thickness of the remainder of the dummy fuse cover layer is measured with an optical measurement equipment. A thickness of the remainder of the fuse cover layer formed inside the fuse opening hole is presumed from a measured thickness obtained from the above measurement in order to judge whether the fuse part is normally formed.

SUMMARY OF THE INVENTION

It is an object of this invention to provide a method of manufacturing a semiconductor device having a fuse conductive pattern, enabling (1) an insulation layer having a uniform thickness to be formed on the fuse conductive pattern, and (2) an LSI conductive pattern formed around a fuse opening hole to be prevented from corrosion.

It is another object of this invention to provide a method of inspecting a semiconductor device having a fuse conductive pattern, enabling whether or not a fuse part is normally formed to be easily judged.

In order to accomplish the foregoing objects, the present invention comprises providing a silicon substrate; forming a fuse conductive pattern on the silicon substrate; forming a first insulation layer on the fuse conductive pattern and the silicon substrate, the first insulation layer having a first etching speed; forming a stopper pattern on a first region of the first insulation layer to cover the fuse conductive pattern, the stopper pattern having a second etching speed; forming a second insulating layer on the stopper pattern and the first insulation layer, the second insulation layer having a third etching speed; etching a second region of the second insulating layer to form an opening wherein the second region is within the first region and an etching condition is set that the first etching speed is higher than the second etching speed so that the stopper pattern is exposed on a bottom of the opening; and etching the exposed stopper pattern with an etching condition that the second etching speed is faster than the third etching speed so that the exposed stopper pattern is removed and the first insulation layer remains on the fuse conductive pattern.

BRIEF DESCRIPTION OF THE DRAWING

White the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
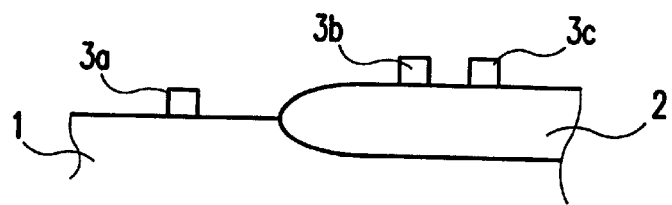
FIGS. 1(a) through 1(e) are sectional views showing steps of a process of manufacturing a semiconductor device according to the first embodiment of the present invention.

FIGS. 1(a) through 1(e) are sectional views showing process steps of manufacturing a semiconductor device according to the first embodiment of the present invention. As shown in FIG. 1(a), a conductive layer is formed on a silicon substrate 1 including a field oxide layer 2 at a predetermined area thereof. A conductive pattern 3 is formed by patterning the conductive layer. The conductive pattern 3 includes an LSI conductive pattern 3a for transferring signals or applying predetermined voltage to the circuits within the semiconductor device and fuse conductive patterns 3b and 3c connected to fuse circuits. In FIGS. 1(a) through 1(e), the fuse patterns 3b and 3c are formed at a predetermined position of the field oxide layer 2. The conductive layer making the conductive pattern 3 is a polysilicon layer formed by CVD method, a multilayer layer composed of a polysilicon layer and a metal high melting point silicide layer (an eutectic layer made of silicon and a metal having high melting point such as tungsten, titanium). The conductive layer has a thickness of 1,000 to 3,000 angstroms.

Figure 1B:
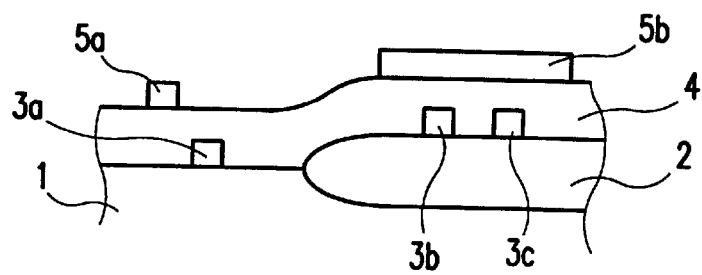

As shown in FIG. 1(b), an insulation layer 4 (a first insulation layer as a fuse cover layer) and a conductive layer 5 are formed, in this order, on the silicon substrate 1 having the conductive pattern 3 formed thereon. A conductive pattern 5 is formed by patterning the conductive layer 5. The conductive pattern 5 includes an LSI conductive pattern 5a and a stopper portion 5b formed so as to cover the whole fuse pattern area. The stopper portion 5b has no function of conductive pattern so that the portion 5b is not connected to the other conductive pattern nor circuits of the LSI. The portion 5b is formed on the insulation layer 4 in the shape of an island above the fuse patterns. The insulation layer 4 is a BPSG layer (a SiO₂ layer with phosphorus or boron doped therein) formed by CVD method using SiH₄ gas or a multilayer including a SiO₂ layer and a BPSG layer. The insulation layer 4 has a thickness of 5,000 to 15,000 angstroms. The conductive layer making the conductive pattern 5 is a polysilicon layer or a multilayer including a polysilicon layer and a metal suicide layer with a multilayer layer composed of a polysilicon layer and a multilayer layer composed of a polysilicon layer and a metal silicide layer with high melting point metal silicide layer. The conductive layer has a thickness of 1,000 to 3,000 angstroms.

Figure 1C:
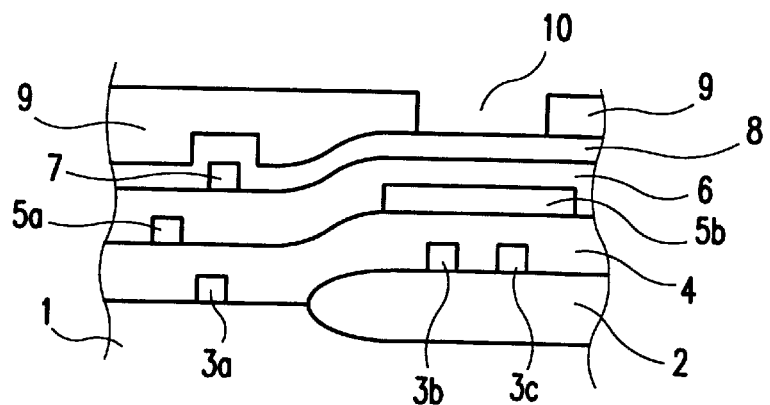

As shown in FIG. 1(c), an insulation layer 6 (a second insulation layer) and a conductive layer are formed, in this order, on the insulation layer 4 and the conductive patterns 5 formed thereon. An LSI conductive pattern 7 is formed by patterning the conductive layer. A protection layer 8 (a passivation layer) is formed on the insulation layer 6 and the LSI conductive pattern 7. Then, a photoresist pattern 9 having a fuse opening hole 10 is formed on the protection layer 8. The insulation layer 6 is a BPSG layer formed by CVD method using SiH₄ gas and has a thickness of 7,000 to 20,000 angstroms. The conductive layer making the LSI conductive pattern 7 is an alloy layer containing aluminum as a principal ingredient (an Al alloy layer) formed by sputtering method or a tungsten layer (a W layer) The protection layer 8 is a silicon nitride layer (SiN layer) formed by CVD method. The protection layer 8 has a thickness of 7,000 to 10,000 angstroms. The fuse opening hole 10 has a dimension smaller than the stopper pattern 5b.

Figure 1D:
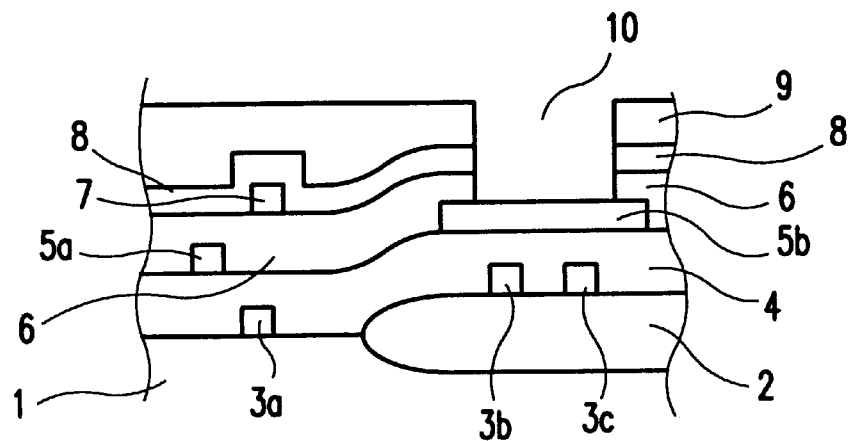

As shown in FIG. 1(d), the protection layer 8 and the insulation layer 6 are removed by dry etching method using the photoresist pattern 9 as a mask. In the dry etching of the protection layer 8, an etching gas composed of Ar with a flow rate of 1,000 sccm, CHF₃ of 30 sccm, CF₄ of 50 sccm and O₂ of 30 sccm, is used.

In the dry etching of the insulation layer 6, an etching condition is employed, wherein a selective ratio of etching speed of the insulation layer 6 to etching speed of the stopper pattern 5b (defined as " an etching speed of the insulation layer 6/an etching speed of the stopper pattern 5b") is 2 or more. That is, the etching speed of the insulating layer 6 is faster than that of the stopper pattern 5b. Such condition is possible to set because the stopper pattern 5b is not an insulation layer but a conductive layer. In addition, an etching condition is employed, wherein a selective ratio of etching speed of the insulation layer 6 to the protection layer 8 is as small as possible since a portion of the insulation layer 8 may not be removed even after etching. Further, an etching condition is employed, wherein etching time for the insulation layer 6 is set long enough to allow the insulation layer 6 to be overetched. From the above etching conditions, the protection layer 8 and the insulation layer 6 can be firmly removed within the area of the fuse opening hole 10 without etching the insulation layer 4. If there is unevenness in layer thickness of the insulation layer 6 and the protection layer 8 and unevenness in etching depth for such layers, a selected etching ratio and an overetching resolve such problem.

In the dry etching of the insulation layer 6, an etching gas composed of Ar with a flow rate of 1,000 sccm, CHF₃ of 30 sccm and CF₄ of 50 sccm is used. Also, discharge pressure of 0.25 Torr and input power of 1,300 W are employed. At this time, in case tungsten silicide layer (a WSi layer) is used for the stopper pattern 5b, the above-mentioned selective ratio becomes approximately 20 to 30, and in case polysilicon layer is used for the stopper pattern 5b, the selective ratio becomes approximately 3 to 6.

Figure 1E:
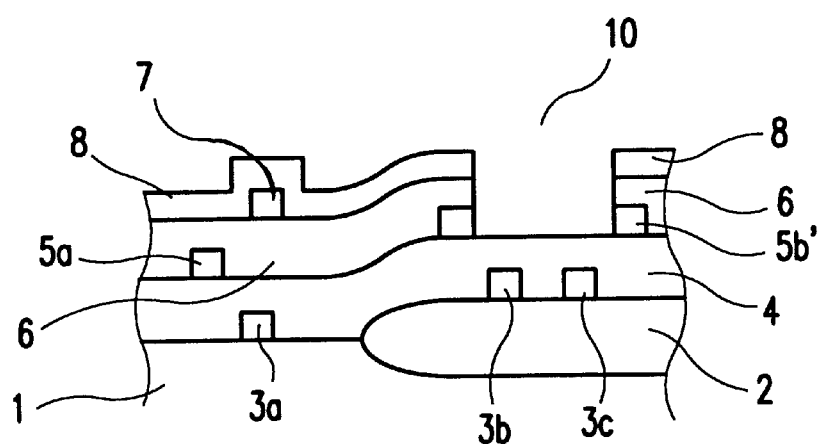

As shown in FIG. 1(e), a portion of the stopper pattern 5b inside the fuse opening area 10 is removed by dry etching with the photoresist pattern 9 (refer to FIG.1(d)) used as a mask. Then, the photoresist 9 is removed. In this step, a fuse part including fuse conductive patterns 3b and 3c, the insulation layer 4 (the first insulation layer) formed on the fuse patterns 3b and 3c and the fuse opening hole 10 to which the insulation layer 4 is exposed is formed.

In the dry etching step of the stopper pattern 5b, an etching condition is employed, wherein a selective ratio of etching speed of the stopper pattern 5b to the insulation layer 4 is more than 1. That is, the etching speed of the stopper pattern 5b is faster than that of the insulation layer 4. By employing such condition, a portion of the stopper pattern 5b inside the fuse opening hole 10 can be firmly removed. Further, the insulation layer 4 having a uniform thickness for enabling the fuse blow can remain on the fuse patterns 3b and 3c without exposure thereof.

In the dry etching step of the stopper pattern 5b, an etching gas composed of Ar with a flow rate of 1,000 sccm, SF₆ of 75 sccm and O₂ of 30 (sccm) is used. Discharge pressure of 1 Torr and input power of 1,300 W are employed.

At this time, the above-mentioned selective ratio becomes approximately 1.5 to 2. A portion of the stopper pattern 5b' projecting outside the fuse opening hole 10 remains without being etched, because the fuse opening hole 10 is smaller than the stopper pattern 5b as described above. The portion of the stopper pattern 5b', however, gives no bad influence on the fuse blow or operation of circuits of the semiconductor device.

Where a portion of the stopper pattern 5b remains inside the fuse opening hole 10, the fuse blow is impossible. However, it is easy to judge whether there is such remainder of the stopper pattern 5b, by simply observing the fuse opening hole 10 shown in FIG. 1(e) with an optical microscope. The stopper pattern 5b can be distinguished from the insulation layer 4 since color and brightness of the stopper pattern 5b is different from those of the insulation layer 4. Thus, a breakdown inspection can be omitted. Where the stopper pattern 5b inside the fuse opening hole 10 is judged to have been removed, the protection layer 8 and the insulation layer 6 inside the fuse opening hole 10 are considered to have been removed. It is also considered that function of the stopper pattern 5b prevents the insulation layer 4 from being etched out and therefore the fuse conductive patterns 3b and 3c from being exposed. Thus, whether or not the fuse part is normally formed can be easily inspected by observing the fuse opening hole 10 with an optical microscope.

As fully described above, the first embodiment of the present invention comprises forming the stopper pattern 5b made of conductive layer between the insulation layers 4 and 6 formed over the fuse conductive patterns 3b and 3c, etching the insulation layer 6 using the stopper pattern 5b as an etching stopper and then etching the stopper pattern 5b. Therefore, the insulation layer 6 formed on the fuse conductive patterns 3b and 3c can be firmly removed and the insulation layer 4 can be left on the fuse conductive patterns 3b and 3c with an uniform layer thickness everywhere on the whole wafer. This enables that the fuse blow can be firmly performed and the semiconductor device has no malfunction. No additional process is necessary to make the stopper pattern 5b because the stopper pattern 5b is formed in the same process where the LSI conductive pattern 5 is formed. Also, no breakdown inspection is necessary because whether or not the fuse part is normally formed can be easily inspected by a simple observing of the remainder of the stopper pattern 5b with an optical microscope.

In the first embodiment of the present invention, an example of conductive pattern of three layers (the LSI conductive patterns 3a, 5a and 7) and interlayer insulation layer of two layers (the insulation layers 4 and 6) is referred. However, a conductive pattern having 4 or more layers (an interlayer insulation layer of 3 or more layers) may be possible. In case that interlayer insulation layers and conductive patterns are further formed as multiple layers on the insulation layer 6 and the LSI conductive pattern 7, a fuse conductive pattern may be formed from a conductive layer making the conductive pattern 5 and a stopper pattern may be formed from a conductive layer making the LSI conductive pattern 7 as a possible example. In this example, the insulation layer 6 becomes the first insulation layer to be left on the fuse conductive pattern and the insulation layer formed between the stopper pattern and the protection layer becomes the second insulation layer to be removed from the area over the conductive pattern.

Figure 2A:
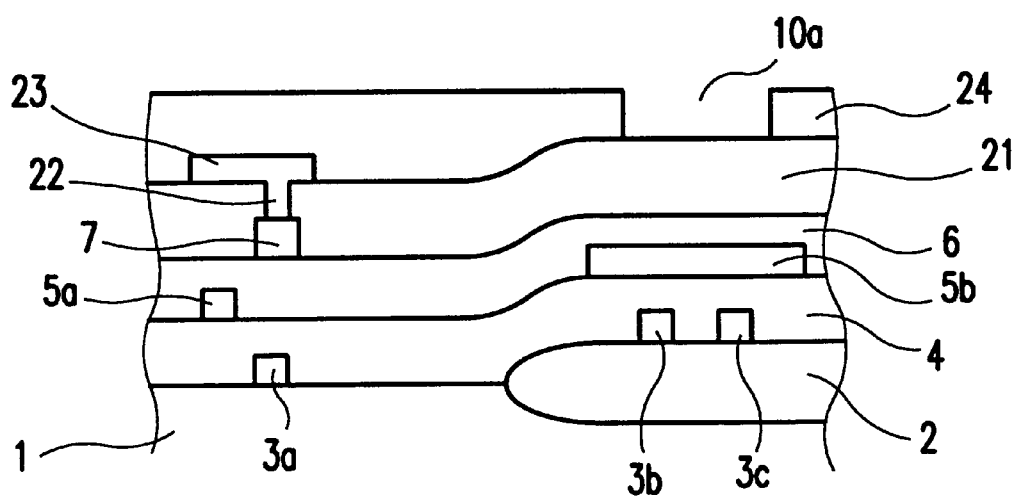
FIGS. 2(a) through 2(d) are sectional views showing steps of a process of manufacturing a semiconductor device according to the second embodiment of the present invention.

FIGS. 2(a) through 2(d) are sectional views showing a process of manufacturing a semiconductor device according to the second embodiment of the present invention. In FIGS. 2(a) through 2(d), the same reference numerals are used for the same parts as are used in FIGS. 1(a) through 1(e). As shown in FIG. 2(a), in accordance with the same processes described in FIG. 1(a) to 1(c), the conductive layer pattern 3 including the LSI conductive pattern 3a and the fuse conductive patterns 3b and 3c is formed on the silicon substrate 1 having the field oxide layer 2 formed thereon. The insulation layer 4 (the first insulation layer) is formed on the conductive layer pattern 3. The conductive pattern 5 including the LSI conductive pattern 5a and the stopper pattern 5b is formed on the insulation layer 4. The insulation layer 6 is formed on the conductive pattern 5. Finally, the LSI conductive pattern 7 is formed on the insulation layer 6.

Then, an insulation layer 21 having a via hole 22 reaching the LSI conductive pattern 7 is formed over the silicon substrate 1 having the LSI conductive pattern 7 formed thereon. A conductive layer is formed on the insulation layer 21. An LSI conductive pattern 23 is formed by patterning the conductive layer. A photoresist pattern 24 having a first fuse opening hole 10a is formed on the LSI conductive pattern 23. In the second embodiment, the insulation layers 6 and 21 are the second insulation layers to be removed from the area over the fuse conductive patterns 3b and 3c. The LSI conductive pattern 7 is electrically connected to the LSI conductive pattern 23 through the via hole 22. The fuse opening hole 10a has a dimension smaller than the stopper pattern 5b. The conductive layer making the LSI conductive pattern 23 is an Al alloy layer or a W layer formed by sputtering method. The insulation layer 21 is a TEOS/O$_3$—SiO$_2$ layer formed by CVD method, wherein TEOS (Tetra ethoxy silane) and O$_3$ react each other. The insulation layer has a thickness of 5,000 to 10,000 angstroms. The TEOS/O$_3$—SiO$_2$ layer is featured by advantage of improving electromigration resistance of an LSI conductive pattern and disadvantage of high water absorption property.

Figure 2B:
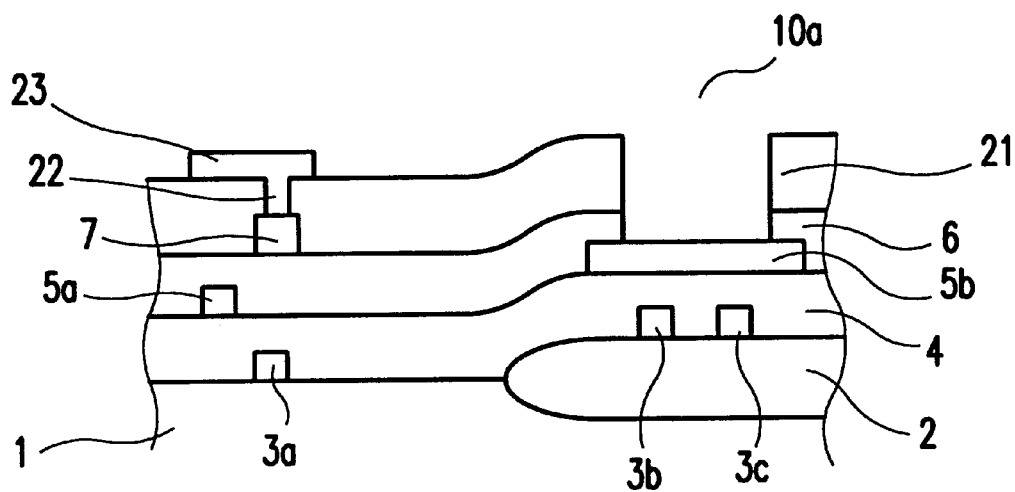

As shown in FIG. 2(b), the insulation layers 21 and 6 inside a first fuse opening hole 10a are removed by dry etching using the photoresist pattern 24 as a mask. Then, the photoresist pattern 24 is removed. The dry etching process is performed, unlike the first embodiment, before the protection layer 8 is formed because the exposed portion of the insulation layer 21 having a water absorption property should be covered by the protection layer 8. For the purpose of etching for the insulation layers 21 and 6, the same condition as is used for etching for the insulation 6 according to the first embodiment. The second insulation layers including the insulation layer 21 can be firmly removed inside the first fuse opening hole 10a without etching the insulation layer 4 by means of the stopper pattern 5b.

Figure 2C:
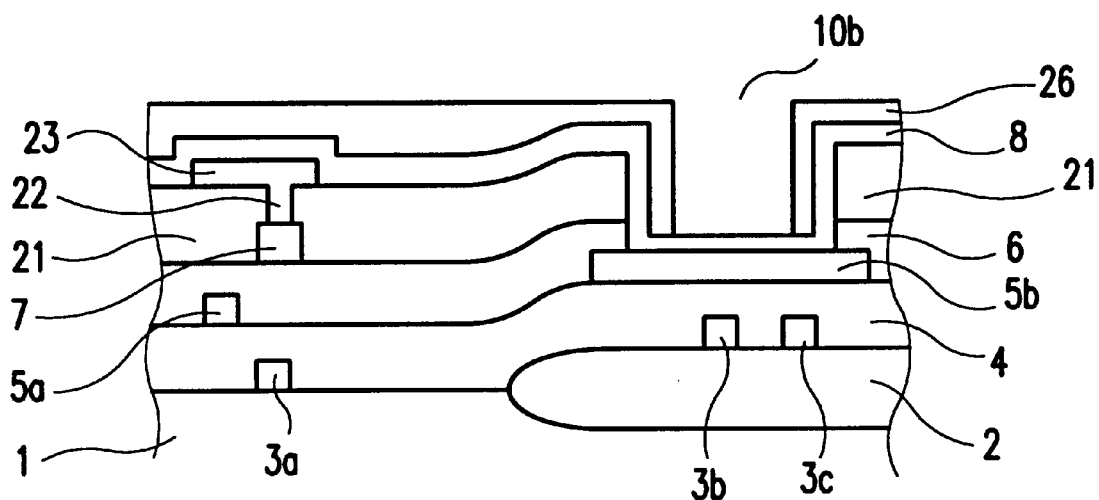

As shown in FIG. 2(c), the protection layer 8 is formed over the silicon substrate 1 so that the exposed side surface of the insulation layer 21 (a portion of a side wall of the first fuse opening hole 10a) is entirely covered by the protection layer 8. Then, a photoresist pattern 26 having a second fuse opening hole 10b is formed on the protection layer 8. The second fuse opening hole 10b has a dimension smaller than the first fuse opening hole 10a. The protection layer 8 formed on the side wall of the first fuse opening hole 10a is covered by the photoresist pattern 26, while the protection layer 8 formed on the bottom of the first fuse opening hole 10a is exposed.

Figure 2D:
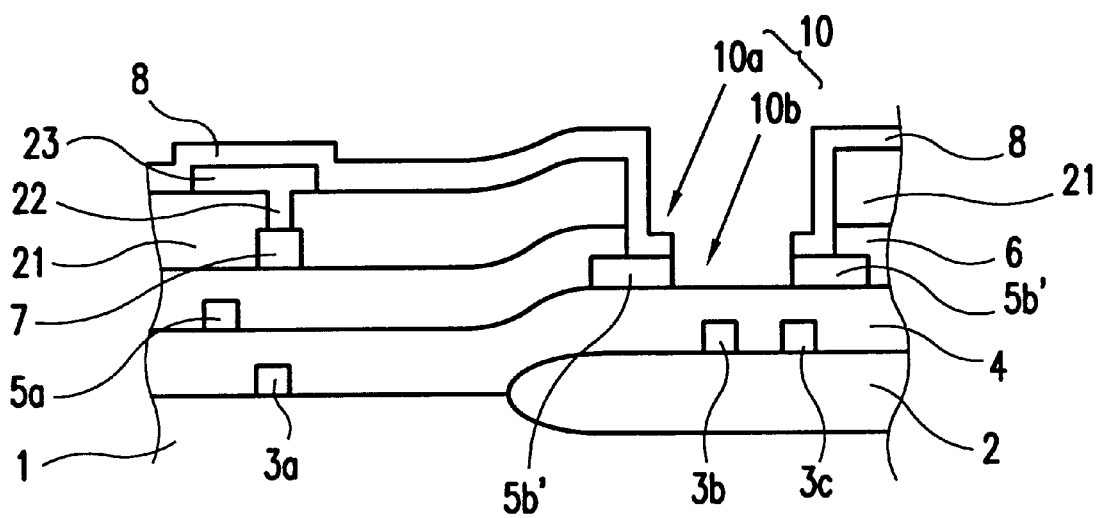

As shown in FIG. 2(d), the protection layer 8 and the stopper pattern 5b inside the second fuse opening hole 10b are removed by dry etching using the photoresist pattern 26 as a mask. Then, the photoresist pattern 26 is removed. For the purpose of etching for the protection layer 8 and the stopper pattern 5b, the same condition as is used in the first embodiment is used. After finishing the above-mentioned process steps, a fuse part is completed, including the fuse conductive patterns 3b and 3c, the insulation layer 4 (the first insulation layer) formed on the fuse conductive patterns 3b and 3c and the fuse opening hole 10 exposing the insulation layer 4.

It is easy to judge where there is the remainder of the stopper pattern 5b, by observing the fuse opening hole 10 shown in FIG. 2(d) with an optical microscope, without breakdown inspection. If the stopper pattern 5b inside the fuse opening hole 10 is judged, as a result of the observation, to have been removed, the protection layer 8 and the insulation layers 21 and 6 inside the fuse opening hole 10 are considered to have been removed. Thus, whether or not the fuse part is normally formed can be easily inspected in the same way as the first embodiment, by simply observing the fuse opening hole 10 with an optical microscope to check whether there is the remainder of the stopper pattern 5b.

As fully described above, according to the second embodiment of the present invention, the insulation layer 4 having a uniform thickness can be left on the fuse conductive patterns because the second insulation layers are etched using the stopper pattern 5b. Accordingly, a fuse part can be formed, wherein the fuse blow is firmly performed and the semiconductor device has no malfunction. Also, the second embodiment comprises the steps of completely removing the second insulation layers including the insulation layer 21 inside the fuse opening hole 10 using the stopper pattern 5b and forming the protection layer 8 in order to entirely cover the second insulation layers including the exposed side surface of the insulation layer 21 (a part of the side wall of the fuse opening area 10). Therefore, the LSI conductive patterns can be prevented from corrosion due to water absorbed by the insulation layer 21. In addition, whether or not a fuse part is normally formed can be inspected without breakdown inspection, by simply observing the remainder of the stopper pattern 5b within the fuse opening hole 10 with an optical microscope.

In the second embodiment, even when an insulation layer having a water absorption property is used as the insulation layer 6, the insulation layer 6 can be prevented from corrosion since the exposed side surface of the insulation layer 6 is covered by the protection layer 8. Also, a fuse conductive pattern may be formed by a conductive layer making the conductive layer pattern 5 and a stopper pattern may be formed by a conductive layer making the LSI conductive pattern 7. In such case, the insulation layer 6 becomes the first insulation layer to be left on the fuse conductive patterns and the insulation layer 21 becomes the second insulation layer to be removed from the area on the fuse portion. In the second embodiment, an example of conductive pattern of four layers (the LSI conductive patterns 3a, 5a, 7 and 23) and interlayer insulation layer of three layers (the insulation layers 4, 6 and 21) is referred. However, a conductive pattern of five or more layers (an interlayer insulation layers of four or more layers) may be possible.

What is claimed is:

1. A method of manufacturing a semiconductor device comprising:

providing a silicon substrate;

forming a fuse conductive pattern on the silicon substrate;

forming a first insulation layer on the fuse conductive pattern and the silicon substrate, the first insulation layer having a first etching speed;

forming a stopper pattern on a first region of the first insulation layer to cover the fuse conductive pattern, the stopper pattern having a second etching speed;

forming a second insulation layer on the stopper pattern and the first insulation layer, the second insulation layer having a third etching speed;

etching a second region of the second insulation layer to form an opening, wherein the second region is within the first region and an etching condition is set such that the third etching speed is higher than the second etching speed so that the stopper pattern is exposed at a bottom of the opening; and etching the exposed stopper pattern with an etching condition set such that the second etching speed is faster than the third etching speed so that the exposed stopper pattern is removed and the first insulation layer remains on the fuse conductive pattern.

2. A method of manufacturing a semiconductor device according to claim 1, wherein the second insulation layer includes an interlayer insulation layer and a protection layer.

3. A method of manufacturing a semiconductor device according to claim 1, wherein the stopper pattern is a part of a conductive layer formed on the first insulation layer.

4. A method of manufacturing a semiconductor device according to claim 3, wherein the conductive layer is formed of polysilicon.

5. A method of manufacturing a semiconductor device according to claim 3, wherein the conductive layer is a multilayer composed of a polysilicon layer and a high melting point metal silicide layer.

6. A method of manufacturing a semiconductor device according to claim 1, wherein an etching time of said etching of a second region of the second insulation layer is set long enough to overetch the second insulation layer.

7. A method of manufacturing a semiconductor device comprising:

providing a silicon substrate;

forming a fuse conductive pattern on the silicon substrate;

forming a first insulation layer on the fuse conductive pattern and the silicon substrate, the first insulation layer having a first etching speed;

forming a stopper pattern on a first region of the first insulation layer to cover the fuse conductive pattern, the stopper pattern having a second etching speed;

forming a second insulation layer on the stopper pattern and the first insulation layer, the second insulation layer having a third etching speed;

etching a second region of the second insulation layer to form an opening wherein the second region is within the first region and an etching condition is set such that the third etching speed is higher than the second etching speed so that the stopper pattern is exposed at a bottom of the opening;

forming a protection layer on the second insulation layer and the exposed opening;

etching a third region of the protection layer to expose the third region of the stopper pattern, wherein the third region is within the second region; and etching the exposed stopper pattern with an etching condition set such that the second etching speed is faster than the third etching speed so that the exposed stopper pattern is removed and the first insulation layer remains on the fuse conductive pattern.

8. A method of manufacturing a semiconductor device according to claim 7, wherein the second insulation layer has a high water absorption property.

9. A method of manufacturing a semiconductor device according to claim 8, wherein the second insulation layer is a TEOS layer.

10. A method of manufacturing a semiconductor device according to claim 7, wherein the stopper pattern is a part of a conductive layer formed on the first insulation layer.

11. A method of manufacturing a semiconductor device according to claim 10, wherein the conductive layer is formed of polysilicon.

12. A method of manufacturing a semiconductor device according to claim 10, wherein the conductive layer is a multilayer composed of a polysilicon layer and a high melting point metal silicide layer.

13. A method of manufacturing a semiconductor device according to claim 7, wherein an etching time of said etching of a second region of the second insulation layer is set long enough to overetch the second insulation layer.

14. A method of inspecting a semiconductor device having a fuse conductive pattern, comprising:

providing a silicon substrate;

forming a fuse conductive pattern on the silicon substrate;

forming a first insulation layer on the fuse conductive pattern and the silicon substrate, the first insulation layer having a first etching speed;

forming a stopper pattern on a first region of the first insulation layer to cover the fuse conductive pattern, the stopper pattern having a second etching speed;

forming a second insulation layer on the stopper pattern and the first insulation layer, the second insulation layer having a third etching speed;

etching a second region of the second insulation layer to form an opening wherein the second region is within the first region and an etching condition is set such that the third etching speed is higher than the second etching speed so that the stopper pattern is exposed at a bottom of the opening;

etching the exposed stopper pattern with an etching condition set such that the second etching speed is faster than the first etching speed so that the exposed stopper pattern is removed and the first insulation layer remains on the fuse conductive pattern; and visually inspecting the stopper layer.

15. A method of inspecting a semiconductor device according to claim 14, wherein the second insulation layer includes an interlayer insulation layer and a protection layer.

16. A method of inspecting a semiconductor device according to claim 14, wherein the stopper pattern is a part of a conductive layer formed on the first insulation layer.

17. A method of inspecting a semiconductor device according to claim 16, wherein the conductive layer is formed of polysilicon.

18. A method of inspecting a semiconductor device according to claim 16, wherein the conductive layer is a multilayer composed of a polysilicon layer and a high melting point metal silicide layer.

19. A method of inspecting a semiconductor device according to claim 14, wherein an etching time of said etching of a second region of the second insulation layer is set long enough to overetch the second insulation layer.

20. A method of inspecting a semiconductor device according to claim 14, wherein said visually inspecting the stopper layer is conducted for confirming a perfect etching of the second insulation layer and the stopper layer.

* * * * *